United States Patent [19]
Farassat

[11] Patent Number: 5,906,706
[45] Date of Patent: May 25, 1999

[54] WIRE GUIDE FOR A BONDING MACHINE

[75] Inventor: Farhad Farassat, Taufkirchen, Germany

[73] Assignee: F & K Delvotec Bondtechnik GmbH, Ottobrunn, United Kingdom

[21] Appl. No.: 08/874,108

[22] Filed: Jun. 12, 1997

[51] Int. Cl.⁶ .................................................. H01L 21/607
[52] U.S. Cl. ...................... 156/580.1; 228/1.1; 228/4.5
[58] Field of Search ................... 228/180.5, 1.1, 228/4.5, 110.1; 156/73.1, 73.2, 580.1, 580.2

[56] References Cited

U.S. PATENT DOCUMENTS

| | | | |
|---|---|---|---|
| 4,600,138 | 7/1986 | Hill | 228/179 |
| 4,786,860 | 11/1988 | Zimmerman | 324/65 R |
| 4,976,392 | 12/1990 | Smith et al. | 228/102 |
| 5,148,959 | 9/1992 | Cain et al. | 228/4.5 |
| 5,190,206 | 3/1993 | Miller et al. | 228/102 |
| 5,558,270 | 9/1996 | Nachon et al. | 228/180.5 |
| 5,685,476 | 11/1997 | Miyoshi | 228/180.5 |

*Primary Examiner*—James Sells
*Attorney, Agent, or Firm*—Westman, Champlin & Kelly, P.A.

[57] ABSTRACT

A wire guide is provided for use in a wire bonding machine. The guide can be releasably attached to a bonding wedge and a transducer of the bonding head. The wire guide comprises guide members integrally formed with the wire guide body for feeding the bonding wire to the wedge. Securement means are integrally formed with the guide body for releasably mounting the guide. The securement means are formed such that movement of the guide body with respect to the bonding head allows its release.

8 Claims, 3 Drawing Sheets

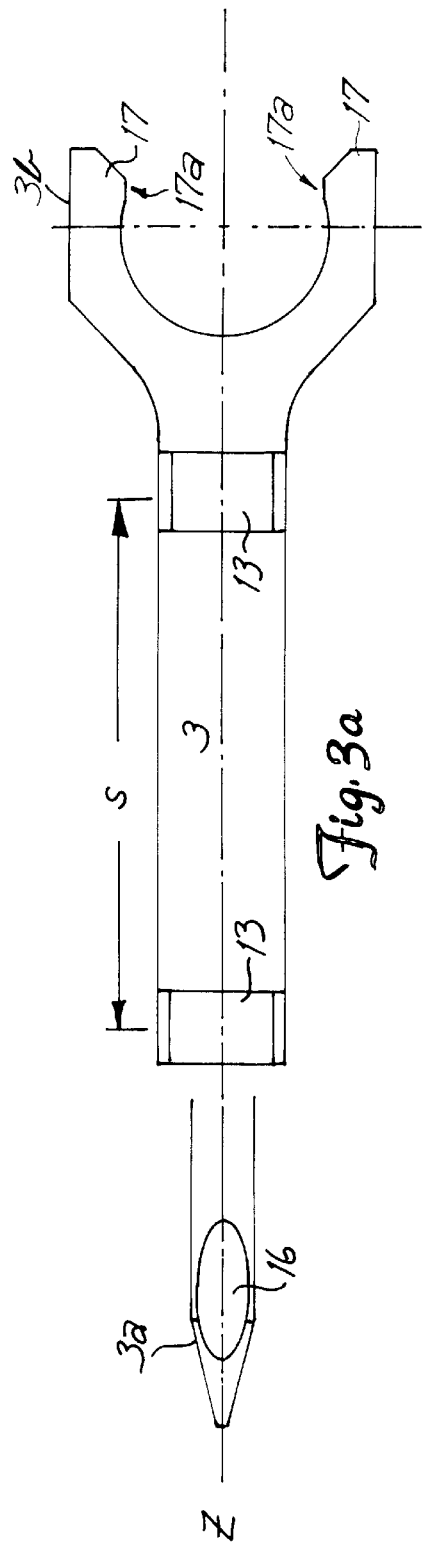
Fig. 3a
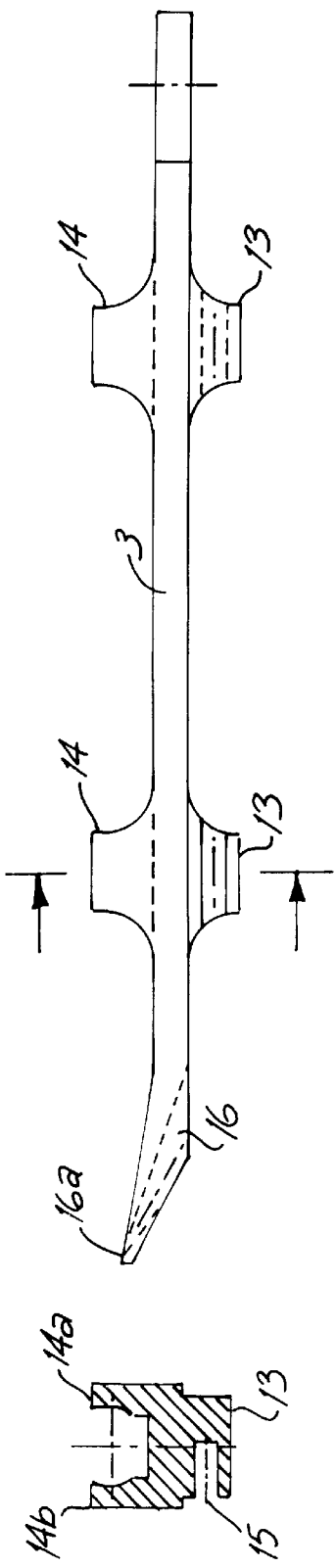
Fig. 3b
Fig. 3c

WIRE GUIDE FOR A BONDING MACHINE

The present invention relates to a wire guide attachable to a bonding head in a wire bonding machine.

Wire bonding machines are employed in the electronics industry to fabricate a variety of electronic devices. Generally, an aluminum or gold wire is supplied to the tip of a so-called bonding wedge. The wedge is connected to a transducer, which transmits ultrasonic energy through the wedge to the wire to thereby form a bond with a substrate. Such machines also include a capillary arranged adjacent to the wedge for feeding the wire to be bonded to the tip of the wedge. A conventional bonding machine is disclosed in EP-A-0 649 701, where the capillary comprises a tubular member for feeding the wire. The capillary is fixed to the bonding head by means of adjustment screws.

The conventional capillary feeding device has the following drawbacks. The capillary becomes misaligned after operation of the bonding machine for some time, which necessitates an interruption of the bonding process. The capillary must be realigned with the adjustment screws, which itself is a delicate and time-consuming process. In addition, the conventional capillary tube is of large dimension and is mounted parallel but spaced from the wedge. In the bonding operation, this relatively bulky arrangement does not allow bonds to be set close to the walls or edges in electronic devices.

An object of the present invention is to provide an improved wire guide which substantially eliminates the need for realignment, which can be easily assembled and disassembled and which is inexpensive in manufacture.

According to the present invention, a wire guide is provided and a bonding head is provided. The guide comprises an elongate guide body 3 having first and second ends. Guide members are integrally formed with the guide body for feeding the bonding wire to the wedge. Securement means are also integrally formed with the guide body for releasably mounting the guide to the bonding head. The securement means are formed so as to release from the bonding head by simple movement of the guide body with respect to the bonding head.

Preferably, the securement means comprise a pair of U-shaped brackets disposed along the longitudinal axis of the guide body at a predetermined spacing. The U-shape of the brackets is such that the wedge can be received therein. In this manner, the wire guide is directly secured to the wedge in parallel alignment.

In a further embodiment, the securement means comprise a fork-shaped end piece, which is adapted to engage with the transducer of the bonding head. The two legs of the fork are formed to secure the transducer therebetween in a snap action manner. The wire guide is then fixed by this connection in axial direction with respect to the wedge. Thus the opposite end of the wire guide, which feeds the wire to the wedge tip is always in proper axial alignment with respect to the wedge tip.

The wire guide of the present invention is essentially self-aligned by means of its securement to the wedge and the transducer. The necessity of interruption of the bonding operation and realignment of the capillary in the prior art is eliminated. Moreover, the wire guide can be manufactured inexpensively of synthetic resins and is also light weight. It can be assembled and disassembled by simple manual manipulation without the necessity of adjustment screws. In addition, the wire guide can be configured of smaller dimension and can be disposed closely adjacent to the bonding wedge. This allows movement of the wedge and formation of bonds on the substrate even closer to the edge wall.

Further objects and advantages of the invention will become apparent in the following description of embodiments in conjunction with the drawings in which:

FIGS. 3a, 3b and 3c show plan and side elevation views respectively of a wire guide according to an embodiment of the present invention;

A wide variety of bonding machines and associated operations are known in the bonding art. The components of the machines may vary depending on the type of wire to be bonded (gold or aluminum) as well as its thickness. In addition, the configuration of the bonding head may depend upon the bonding procedure, for example ball bonding, wedge bonding, wire bonding, etc. The wire guide of the present invention is not limited to the particular type of wedge bonding machine.

Figure 1:
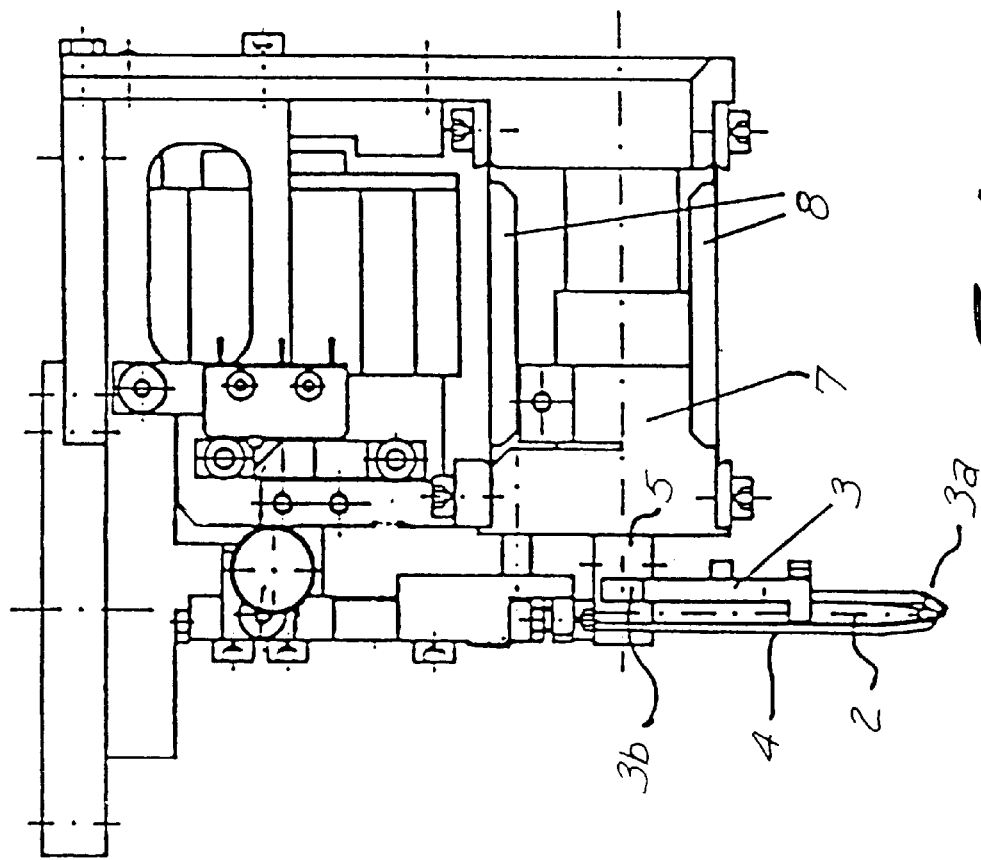
FIG. 1 shows an elevation view of a bonding head to which a wire guide according to one embodiment of the present invention is attached.

FIG. 1 shows a bonding head of a bonding machine which may be used for thin or thick wires. As will be understood, the entire bonding head moves vertically with respect to the bonding machine to approach and retract from a substrate to which a bond is to be formed. The wedge 2 is thereby directed to a predetermined point on the substrate where a bond is to be formed. The tip of the wedge 2 presses a bonding wire to the substrate, while the transducer 5 supplies ultrasonic energy to form the bond. The bonding head in FIGS. 1 and 2 also comprises transducer holding means 7, 8 as well as a knife blade 4, however, these features are not of importance here.

Figure 2:
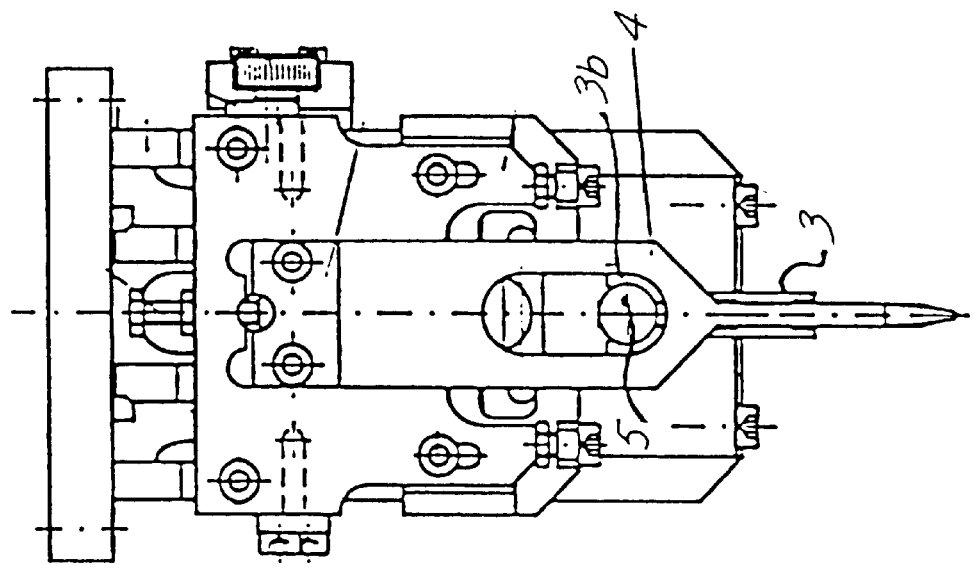
FIG. 2 is a side elevation view of the bonding machine of FIG. 1.

FIGS. 1 and 2 show an embodiment of the present wire guide when attached to the bonding head. The wire guide body 3 comprises a tip end piece 3a mounted adjacent to the tip of the wedge 2. The opposite end 3b of the guide body 3 is secured to the transducer 5. As shown in FIG. 2, the fork-shaped end piece 3b has two legs which are formed to secure the transducer 5 therein.

Details of the present embodiment are shown in FIGS. 3a, 3b and 3c. An elongate guide body 3 has guide members 13 integrally formed therewith. Securement means 14, 17 are also integrally formed with the guide body 3. The entire wire guide element is integrally formed, preferably injection moulded from a synthetic material. The synthetic material is preferably a synthetic resin having good properties in thermal resistance, durability, strength and wear resistance. The resin material should also have a low coefficient of friction with respect to the bonding wire, such as an aluminum wire.

The securement means of this embodiment comprise a pair of U-shaped brackets 14, shown in FIGS. 3b and 3c. The brackets are disposed along the longitudinal axis Z of the guide body 3 at a predetermined spacing s. The U-shape of the brackets 14 is formed to receive the bonding wedge 2 therein. As seen in FIG. 3c, the inner surfaces of the segments 14b of the U are shaped to match the shape of the outer surface of the wedge. In this manner, the wire guide can be slipped onto the wedge beginning from the tip end of the wedge. The fit between the securement means 14 and the wedge 2 should be such that contact between the two members exists and the parallel alignment of the guide to the wedge is maintained.

The securement means also include a fork-shaped end piece 3b as best shown in FIG. 3a. The fork extends axially from the guide body 3. The two legs 17 of the fork are formed to secure the transducer 5 therein as shown in FIG. 2. The interior of the fork is formed with a radius of curvature which substantially corresponds to that of the transducer 5. The inner surfaces of the outer portion of the legs 17 are formed with small projections 17a. When mounting the fork-shaped end piece 3b, the resilient legs 17 are forced outwardly when the projections 17a engage the transducer 5 in a snap action manner. The end piece 3b therefore securely holds the wire guide to the transducer 5. This in turn fixes the alignment of the wire guide in axial direction with respect to the wedge 2. In this manner, the other end of the wire guide formed as the tip piece 3a is kept in axial alignment with the tip of the wedge 2.

The guide members for guiding and feeding the bonding wire to the tip piece 3a are formed as a pair of holders 13 as shown in FIGS. 3a, 3b and 3c. The holders are preferably also arranged at the predetermined distances to be discussed below.

The holders 13 are integrally formed with the guide body 3 opposite the U-shaped brackets 14. The holders 13 have slots 15 respectively, as best seen in FIG. 3c. The bonding wire is supplied from supply means and fed through the slots 13 to an opening 16 in the tip piece 3a of the guide body 3.

The slots 15 of the holders 13 open in a direction transverse to the longitudinal axis Z of the guide body 3. One slot opens in one lateral direction, while the other slot opens to the opposite lateral direction. This arrangement prevents the wire from leaving the slots. The holders 13 may also be provided with holes bored therein instead of slots for guiding the wire. In either case, the cross-section of the slots or holes is dimensioned so as to provide a braking effect on the wire. This allows the wire to be held straightened during the feeding process and prevents bends in the wire.

The tip piece 3a comprises an aperture 16 leading from the guide side of the body 3 and exiting at an opening 16a at the wedge side of the body 3. The opening 16a lies adjacent to the tip of the bonding wedge. As mentioned above, the alignment of the opening 16a with respect to the wedge tip is self-adjusted by the configuration of the brackets 14 and the fork-shaped end piece 3b.

Figure 4:
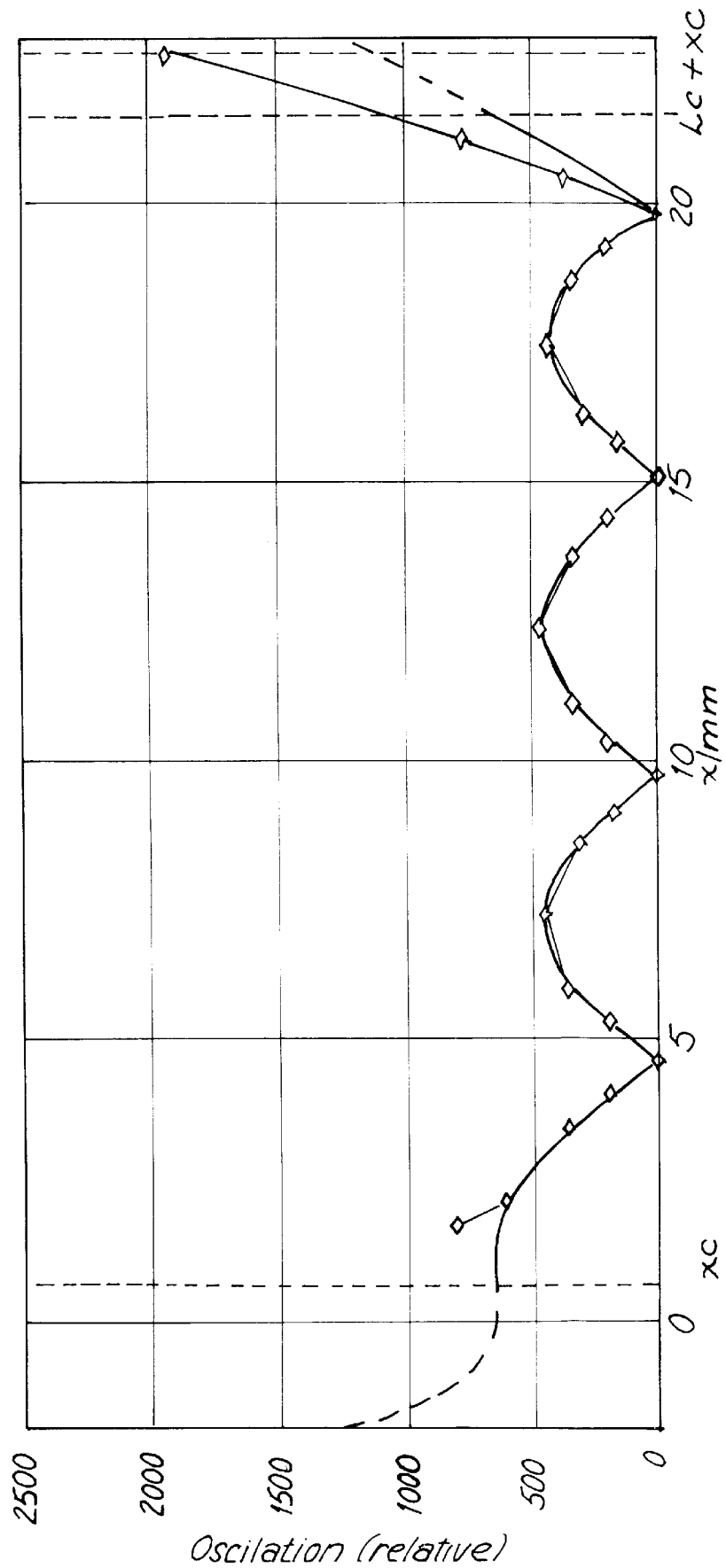
FIG. 4 shows a model calculation of the oscillations which arise in the wedge upon application of ultrasonic energy.

The predetermined spacing s of the brackets 14 is determined on the basis of the oscillation arising in the wedge due to the ultrasonic energy applied by the transducer. As shown in FIG. 4, the oscillation of the wedge transverse to its axial direction x has peaks values and points of zero oscillation therebetween. The example shown in FIG. 4 corresponds to a driving frequency of 60 kHz. The securement brackets 14 should preferably engage with the wedge at or about the points of zero oscillation. This is achieved by determining the distance between the zero points and by defining the spacing s between the brackets to be a multiple of the distance between the zero points. This produces an essentially vibration-free attachment of the wire guide to the wedge.

As mentioned above, the wire guide of the present invention can be employed in a wide variety of bonding machines. Important is that the wire guide be fixed by securement means to the wedge for parallel alignment and to the transducer for axial alignment.

I claim:

1. A wire guide for a bonding head in a wire bonding machine, comprising:

an elongate guide body having a first and a second end, guide members integrally formed with said guide body for feeding a bonding wire, and securement means integrally formed with said guide body for releasably mounting the wire guide to the bonding head, wherein the securement means are formed so as to release from the bonding head by movement of the guide body; and wherein the securement means comprise a pair of U-shaped brackets disposed along the longitudinal axis of the guide body at a predetermined spacing, the U-shape of the brackets being formed to receive a wedge of the bonding head.

2. The wire guide of claim 1, wherein the guide body, the guide members and the securement means are integrally formed of synthetic material.

3. The wire guide of claim 1, wherein the securement means comprise a fork-shaped end piece disposed at the second end of the elongate guide body, the two legs of the fork being formed to secure a transducer of the bonding head therebetween in a snap action manner.

4. The wire guide of claim 1, wherein said guide members comprise a pair of holders disposed along the longitudinal axis of the guide body at a predetermined spacing, the holders having slots for receiving the wire to be guided.

5. The wire guide of claim 3, wherein the predetermined spacing is defined as a multiple of the distance between zero points of oscillation of the wedge, the oscillation induced by ultrasonic energy supplied to the wedge and the distance between zero points depending on the frequency of the ultrasonic energy.

6. The wire guide of claim 4, wherein the slots of the pair of holders open in transverse direction to the longitudinal axis of the elongate guide body, the slot of one of the holders opening in opposite transverse direction to that of the other slot of the other holder.

7. The wire guide of claim 4, further comprising a tip piece integrally formed at the first end of the elongate body, the top piece having an aperture arranged to guide the wire from the holders, through the tip piece and to the tip end of the bonding wedge.

8. A bonding head for a wire bonding machine, comprising a bonding wedge connected to a transducer for applying pressure and ultrasonic energy to a wire to be bonded to a substrate and a wire guide as defined in claim 1.

* * * * *